United States Patent [19]
Partovi et al.

[11] Patent Number: 5,487,025
[45] Date of Patent: Jan. 23, 1996

[54] CARRY CHAIN ADDER USING REGENERATIVE PUSH-PULL DIFFERENTIAL LOGIC

[75] Inventors: Hamid Partovi, Westboro, Mass.; Donald A. Draper, San Jose, Calif.

[73] Assignee: Intergraph Corporation, Huntsville, Ala.

[21] Appl. No.: 152,561

[22] Filed: Nov. 15, 1993

[51] Int. Cl.$^6$ ........................................................ G06F 7/50
[52] U.S. Cl. ............................................ 364/788; 364/787
[58] Field of Search ..................................... 364/788, 787

[56] References Cited

U.S. PATENT DOCUMENTS

| | | | |
|---|---|---|---|
| 4,982,357 | 1/1991 | Bechade | 364/788 |
| 5,047,976 | 9/1991 | Goto et al. | 364/788 |
| 5,117,386 | 5/1992 | Persoon et al. | 364/787 |
| 5,235,539 | 8/1993 | Patel | 364/787 |
| 5,270,955 | 12/1993 | Bosshart et al. | 364/787 |
| 5,272,662 | 12/1993 | Scriber et al. | 364/788 |

FOREIGN PATENT DOCUMENTS 2570851 9/1984 France.

OTHER PUBLICATIONS

Colbeck, et al., "A Single-Chip 2B1Q U-Interface Transceiver", *IEEE Journal of Solid-State Circuits*, 6:1614–1623 (Dec. 24, 1989).

Kikuchi, et al., "A Single-Chip 16-bit 25-ns Real-Time Video/Image Signal Processor", *IEEE Journal of Solid-State Circuits*, 6:1662–1667 (Dec. 24, 1989).

Yano, et al., "A 3.8-ns CMOS 16 X 16-b Multiplier Using Complementary Pass-Transistor Logic", *IEEE Journal of Solid Circuits*, 2:388–395 (Apr. 25, 1990).

Shih-Lien, et al., "Evaluation of Two-Summand Adders Implemented in ECDL CMOS Differential Logic", *IEEE Journal of Solid-State Circuits*, 8:1152–1160 (Aug. 26, 1991).

*Primary Examiner*—David H. Malzahn
*Attorney, Agent, or Firm*—Townsend and Townsend and Crew

[57] ABSTRACT

A carry indicating circuit selectively generates a carry-in signal indicating whether the addition of a first plurality of bits results in a carry. A first carry chain circuit selectively generates a first carry-out signal indicating whether the addition of a second plurality of bits together with a carry from the addition of the first plurality of bits results in a carry, and a second carry chain circuit selectively generates a second carry-out signal indicating whether the addition of the second plurality of bits without a carry from the addition of the first plurality of bits results in a carry. Selection circuitry, coupled to the carry indicating circuit and to the first and second carry chain circuits, selects either the first carry-out signal or the second carry-out signal in response to the carry-in signal. The first and second carry chain circuits and/or the selection circuitry each includes a first transistor connected to a second transistor so that the first and second transistors may be initially biased in a nonconducting state when a first node is at a first voltage potential and a second node is at a second voltage potential, the first voltage potential being different from the second voltage potential. Altering circuitry is provided for altering the voltage potential at the first and second nodes for causing the first and second transistors to be in a conducting state and for accelerating the voltage at the first and second nodes to final voltage potentials.

2 Claims, 10 Drawing Sheets

CARRY CHAIN ADDER USING REGENERATIVE PUSH-PULL DIFFERENTIAL LOGIC

BACKGROUND OF THE INVENTION

This invention relates to adders for binary numbers and, more particularly, to a carry chain adder using regenerative push-pull differential logic.

Traditional adders for binary numbers typically add bit pairs sequentially from the least significant bit position to the most significant bit position. Sequential operation is usually necessary because each addition must take into account the possibility of a carry from the previous addition. Consequently, addition of large numbers often takes an excessively long time.

Carry chain adders are frequently used to quickly add two binary numbers without the performance penalty inherent with traditional serial adders. Carry chain adders add subsets of bits at a time, typically one byte of each input number, and each byte addition is performed in parallel with the other byte additions. Of course, each byte addition, in order to be correct, must take into account the possibility of a carry from the previous byte addition in the series. To accommodate the possibility of a carry from the previous byte addition in the series, two parallel additions are performed for each byte of the input numbers. One addition assumes that a carry will be generated from the previous byte addition in the series, and the other addition assumes no carry will be generated from the previous byte addition in the series. By the time the two additions are complete, the existence or nonexistence of a carry from the previous set of additions will be known, and that information may be used by byte carry select circuitry to select the correct result from among the two parallel additions.

Some carry chain adders employ static logic elements which require switching serially connected transistors in order to bring about the desired logic state. This limits the speed at which the circuit may operate and consumes excessive power as some transistors attempt to counteract current flow through other transistors in a crowbar configuration. Other carry chain adders use dynamic logic connected in series, but self-loading of the serially connected logic elements limits the number of dynamic logic elements which may be connected together. For a more detailed discussion of the problems encountered when using known static and dynamic logic elements, refer to copending U.S. patent application Ser. No. 08/121,136, filed Sep. 14, 1993, entitled "CMOS Circuit for Implementing Boolean Functions", incorporated herein by reference.

SUMMARY OF THE INVENTION

The present invention is directed to a carry chain adder which employs regenerative push-pull differential logic to eliminate the problems encountered by the use of conventional static and dynamic circuit elements.

In one embodiment of the present invention, a carry indicating circuit selectively generates a carry-in signal indicating whether the addition of a first plurality of bits results in a carry. A first carry chain circuit selectively generates a first carry-out signal indicating whether the addition of a second plurality of bits together with a carry from the addition of the first plurality of bits results in a carry, and a second carry chain circuit selectively generates a second carry-out signal indicating whether the addition of the second plurality of bits without a carry from the addition of the first plurality of bits results in a carry. Selection circuitry, coupled to the carry indicating circuit and to the first and second carry chain circuits, selects either the first carry-out signal or the second carry-out signal in response to the carry-in signal.

As desired, the first and second carry chain circuits and/or the selection circuitry each includes a first transistor connected to a second transistor so that the first and second transistors may be initially biased in a nonconducting state when a first node is at a first voltage potential and a second node is at a second voltage potential, the first voltage potential being different from the second voltage potential. Altering circuitry is provided for altering the voltage potential at the first and second nodes for causing the first and second transistors to be in a conducting state and for accelerating the voltage at the first and second nodes to final voltage potentials.

DESCRIPTION OF THE PREFERRED EMBODIMENT

OVERVIEW

Figure 1A:
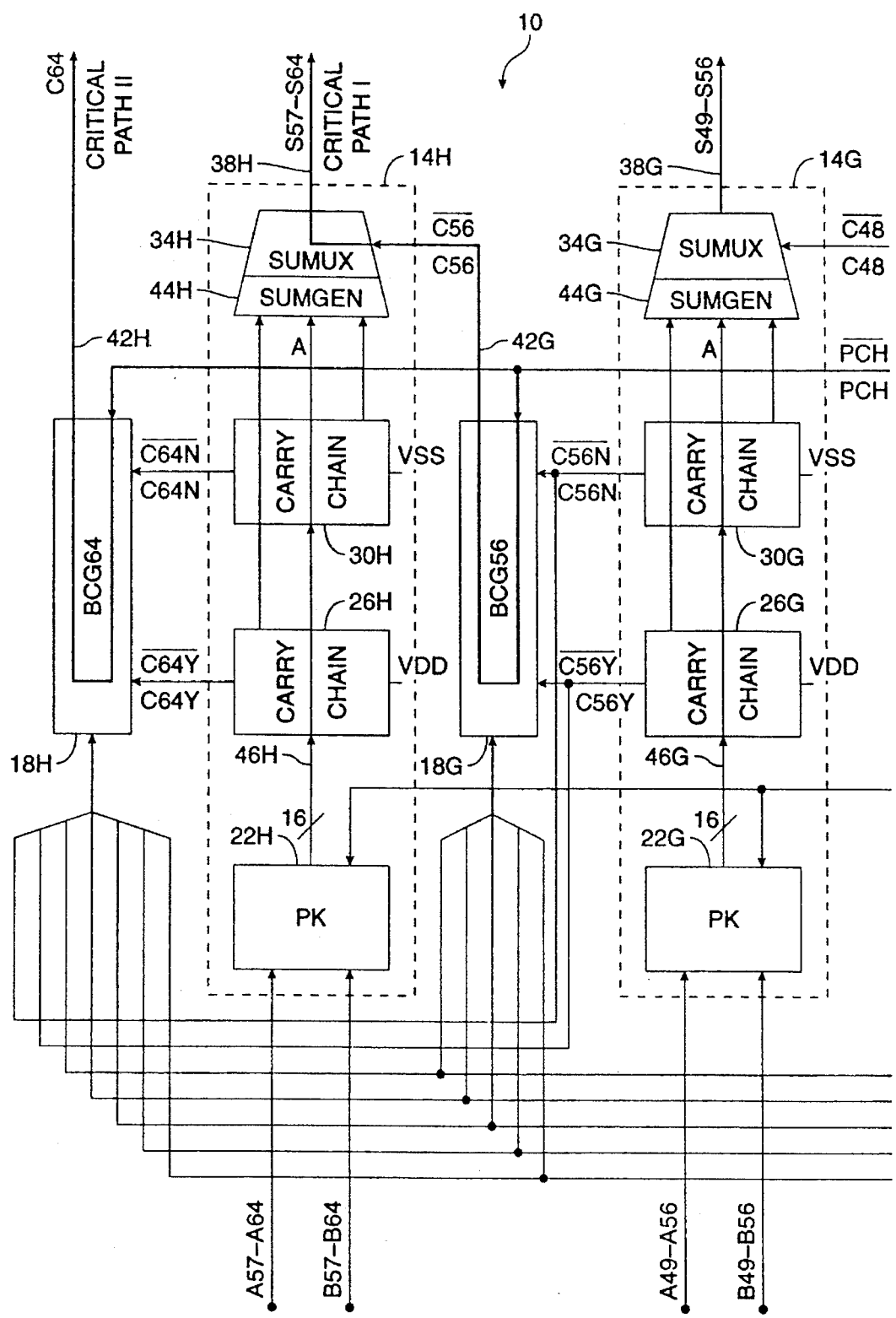
FIGS. 1A–D are block diagrams of a particular embodiment of a carry chain adder according to the present invention.
Figure 1B:
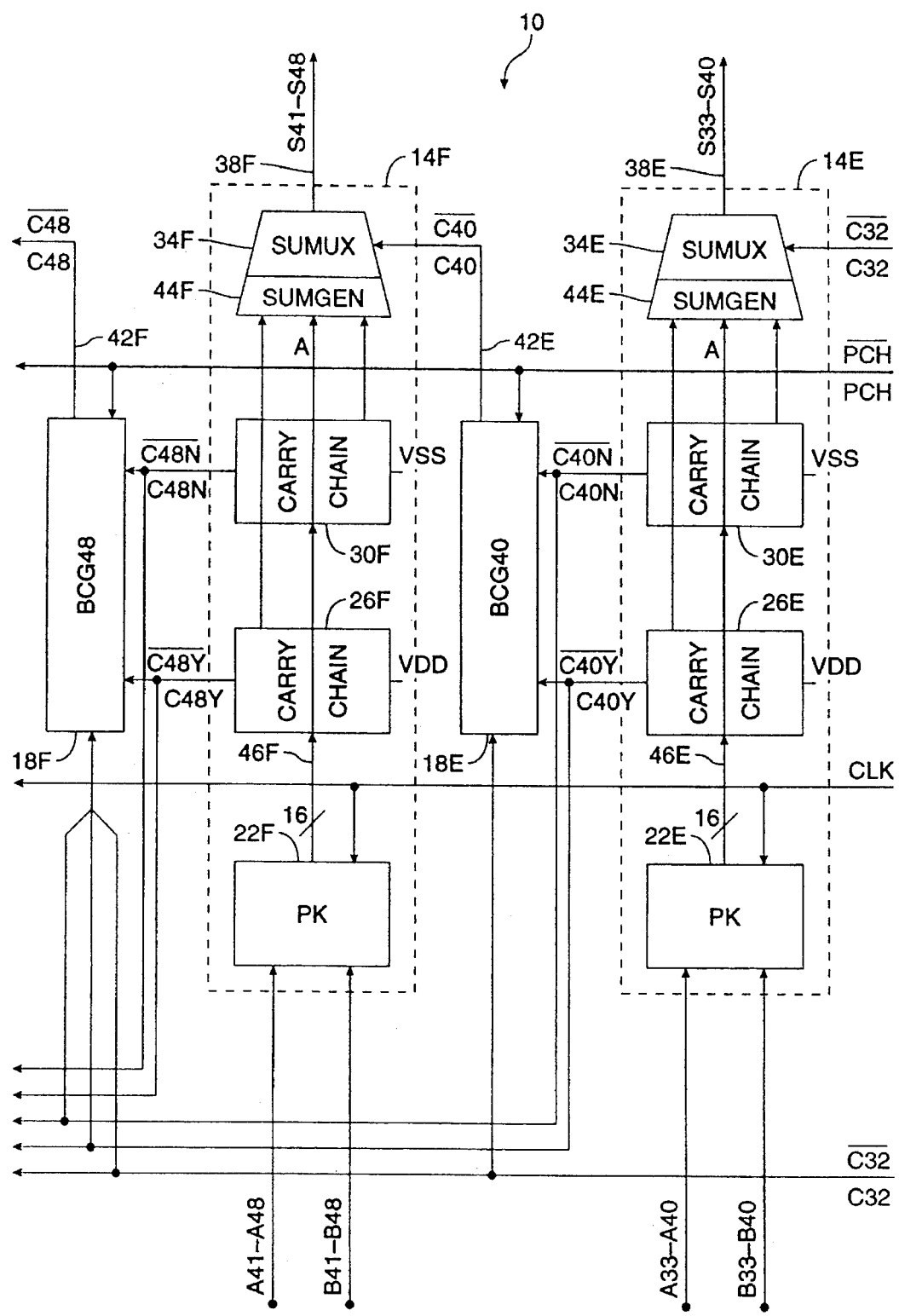
Figure 1C:
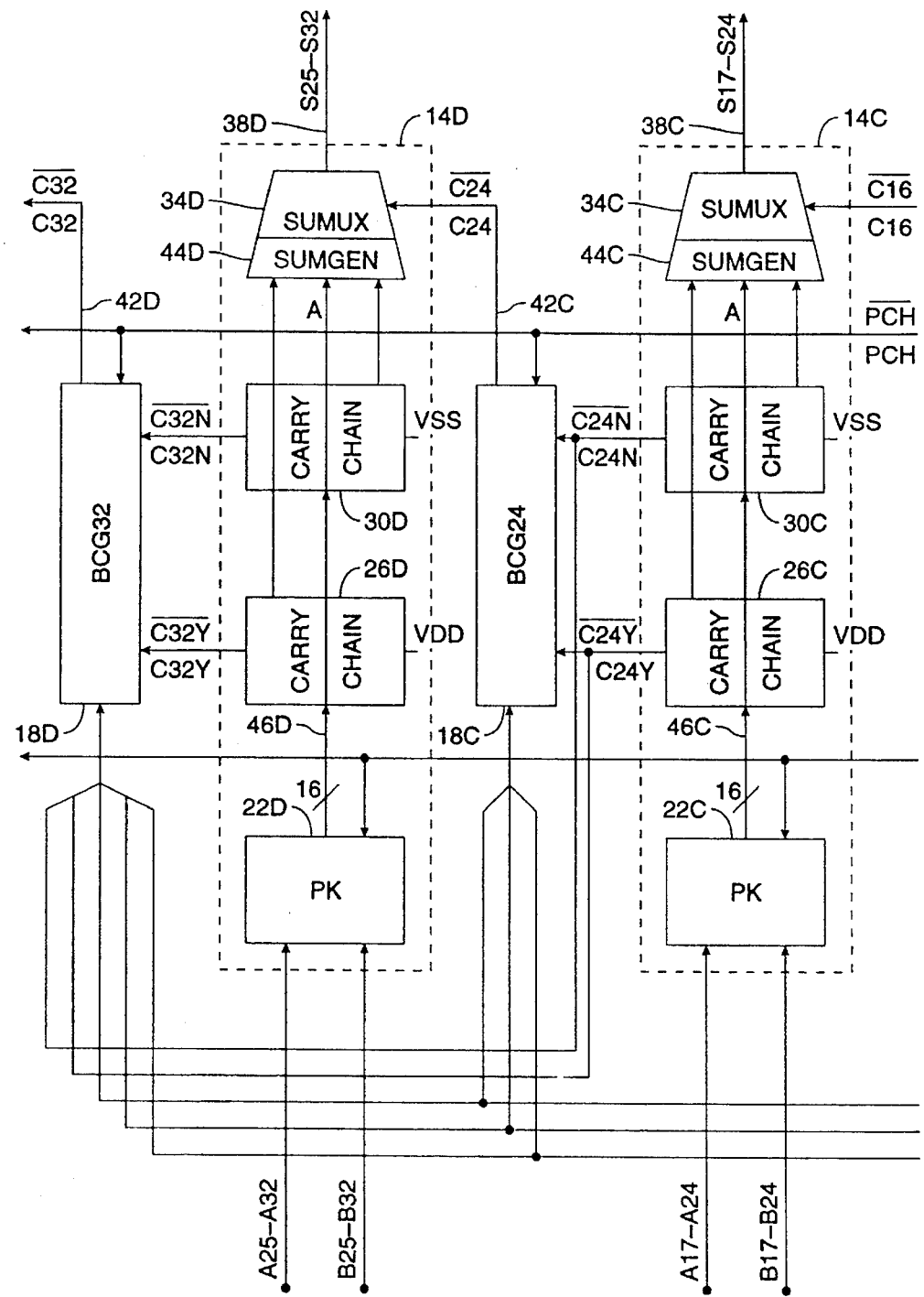
Figure 1D:
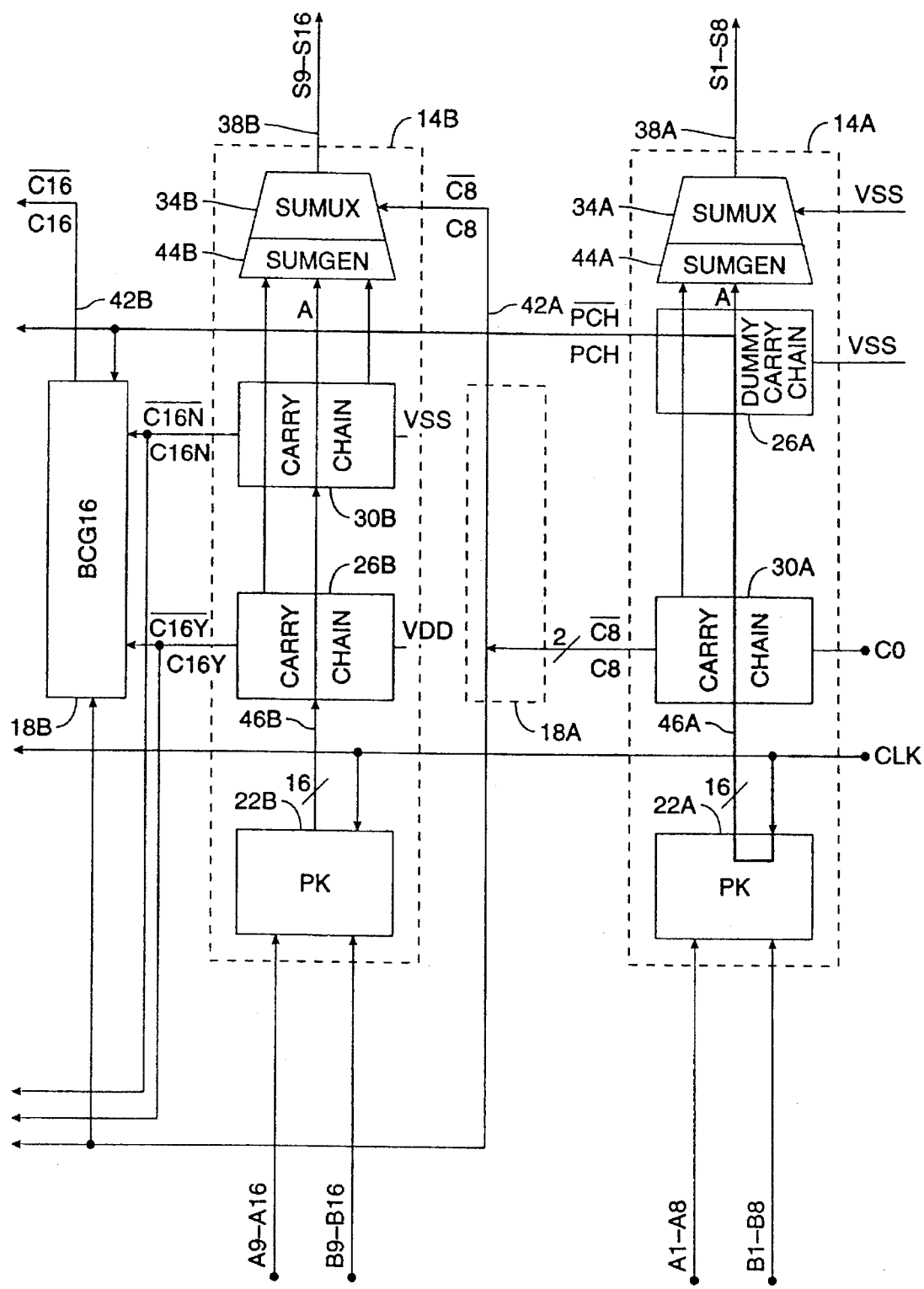

FIGS. 1A and 1D are block diagrams of a particular embodiment of a sixty-four bit adder 10 according to the present invention. Adder 10 includes adder sections 14(A–H) and byte carry generate circuits 18(A–H). Each adder section comprises a propagate-kill circuit 22 (shown as 22(A–H)), a first carry chain circuit 26 (shown as 26(A–H)), a second carry chain circuit 30 (shown as 30(A–H)), and a sum multiplexer 34 (shown as 34(A–H)).

In general, each adder section 14(A–H) adds an eight-bit portion of each of two sixty-four bit numbers and produces an eight-bit sum on sum multiplexer output lines 38(A–H). Of course, each eight-bit addition must take into account the possibility of a carry from the previous adder section. However, it is impractical for each adder section to wait for the carry to be generated by the adder section before it. Generation of the carry would then be the critical path in the system, thus resulting in essentially bit-wise serial addition of the two sixty-four bit numbers. To avoid such a performance penalty, two additions are performed in parallel by the first and second carry chain circuits in each adder section. The first carry chain circuit 26(B–H) in each adder section 14(B–H) adds its eight-bit portions assuming that a carry is generated by the adder section before it, and the second carry chain circuit 30(B–H) in each adder section adds its eight-bit portions assuming that no carry is generated by the adder section before it. The existence or nonexistence of a carry from the previous adder section is determined by byte-carry generate circuits 18(A–H) and is indicated (via signals on sum select lines 42(A–H))at approximately the time the two sums are computed. The signals on sum select lines 42(A–H) are then used by sum multiplexers 34(A–H) to generate (via sum generating circuits 44(A–H) and select the correct sum.

It should be noticed at this point that adder section 14A does not need a carry chain which assumes the existence of a carry, since it adds the eight least significant bits of the two sixty-four bit numbers. Nevertheless, a carry chain 26A, comprising a dummy carry chain, is provided for triggering the operation of other circuit elements as described below.

Propagate-Kill Circuits

Propagate-kill circuits 22(A–H) provide the information necessary for carry chain circuits 26(A–H) and 30(A–H) to carry out their respective additions. More specifically, propagate-kill circuits 22(A–H) provide eight "propagate" signals and eight "kill" signals (one each per bit position) on communication paths 46(A–H). The propagate and kill signals provide information about whether a carry is to be generated by the addition of each bit pair. A propagate signal is generated whenever one of the bits in the bit pair is a one and the other bit is a zero. Thus, if a carry resulted from the addition of the immediately preceding bit pair, then a carry-out will be generated by the addition of the carry-in to the current bit pair. On the other hand, if no carry resulted from the addition of the immediately preceding bit pair, then no carry will result from the addition of the current bit pair. Assuming active high signals, a high (1) propagate signal essentially indicates that the carry-in is "propagated" to the carry out (a one carry-in results in a one carry-out, and a zero carry-in results in a zero carry-out). Additionally, a high propagate signal indicates that the sum of the bit pair will be a zero if the carry-in is a one and a one if the carry-in is a zero. This information may be used to calculate the sums. Propagate-kill circuits 22(A–H) generate the propagate signal by performing the logical operation P=((A and (not B)) or ((not A) and B)).

A kill signal is generated whenever both bits in the bit pair are zero. In that case, no carry will be generated despite the value of the carry-in. A high kill signal indicates that the sum of the bit pair will be the value of the carry-in, i.e., a one if the carry-in is a one, and a zero if the carry-in is a zero. Propagate-kill circuits 22(A–H) generate the kill signal by performing the logical operation K=((not A) and (not B)).

Although not explicitly generated by propagate-kill circuits 22(A–H), a signal referred to as a "generate" signal is generated by some adders whenever both bits in a bit pair are ones (G=(A and B)). In that case, a carry-out will be generated regardless of the value of the carry-in signal. As with the kill signal, a high generate signal indicates that the sum of the bit pair will be the value of the carry-in, i.e., a zero if the carry-in is a zero, and a one if the carry-in is a one.

From the description above, it should be apparent that the propagate, kill, and generate signals are mutually exclusive, and one of the three conditions always exists. Thus, the existence of the generate condition may be ascertained by the absence of both the propagate and kill signals.

Carry Chain Circuits

Figure 2:
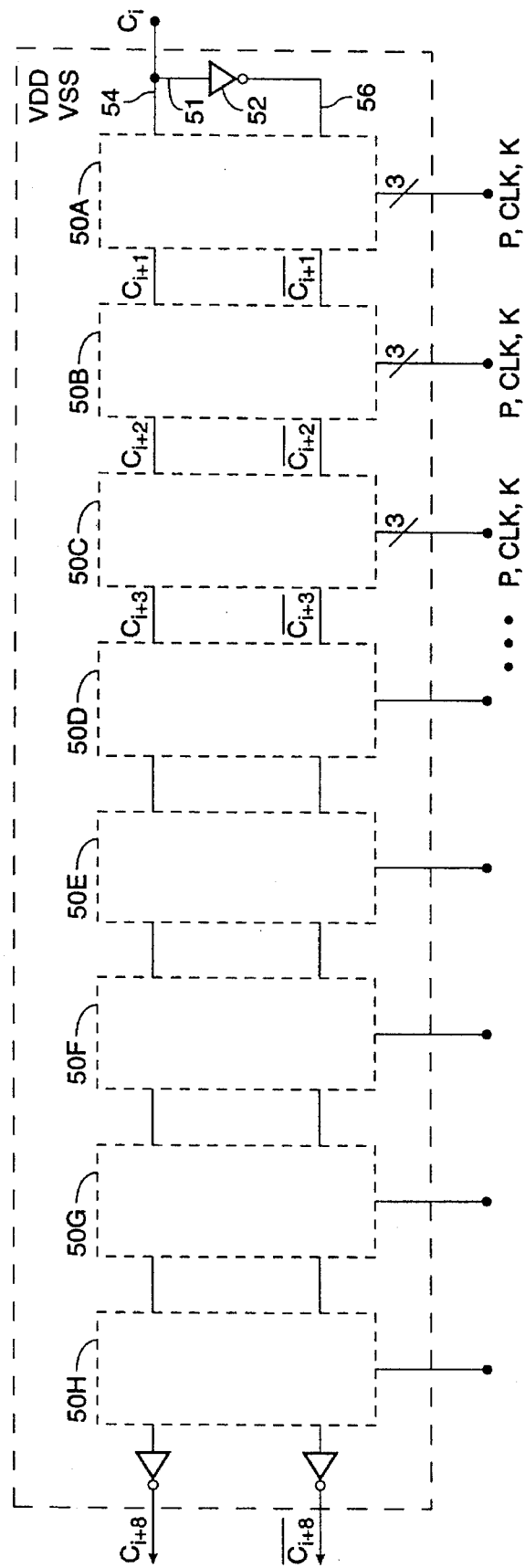
FIG. 2 is a block diagram of a particular embodiment of a carry chain according to the present invention.

FIG. 2 is a block diagram of one of carry chain circuits 26(A–H) or 30(A–H). Each carry chain circuit is constructed the same. The only difference is the value of the presumed carry-in input $C_i$ to the circuit. Carry chain circuits 26(B–H) have a high carry-in input ($V_{dd}$) to assume the existence of a carry from the previous eight-bit addition, and carry chain circuits 30(B–H) have a low carry-in input ($V_{ss}$) to assume the nonexistence of a carry from the previous eight-bit addition. Carry chain circuit 26(A) has a low carry-in input, and carry chain circuit 30A typically also has a low carry-in input, since it is the first carry chain in the series.

Each carry chain circuit includes eight carry chain cells 50(A–H), one for each bit pair. The carry-in input signal is communicated to carry chain cell 50(A) and to an input terminal 51 of an inverter 52 over a line 54. An output terminal 56 of inverter 52 communicates the inverted carry-in signal to carry chain cell 50(A). Each carry chain cell 50(A–H) receives a clock signal CLK and the corresponding propagate (P) and kill (K) signals from its corresponding propagate-kill circuit 22(A–H) and determines whether a carry is generated by the addition of its corresponding bit pair. The result of the determination is communicated to the next carry chain cell in the series. Carry chain cell 50(H) communicates the carry-out signals over lines 60 and 62 to the byte carry generate circuit 18(B–H) associated with the carry chain circuit.

Figure 3:
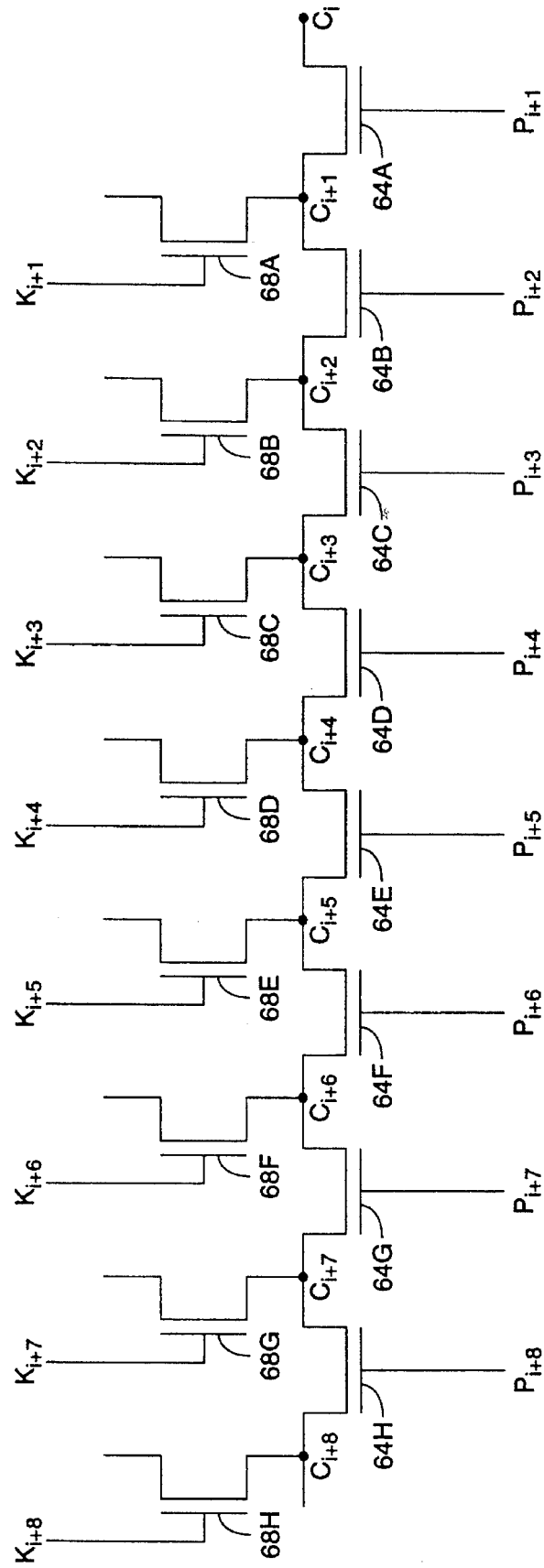
FIG. 3 is a schematic diagram showing the theory of operation of the carry chain circuit of FIG. 2.

Before discussing the specific structure of the carry chain circuit, a general description of the theory of operation of the carry chain circuit is in order. FIG. 3 is a schematic diagram of a single path carry chain comprising serially-connected NMOS transistors 64(A–H), one per bit pair. The gate terminal of each NMOS transistor 64 (A–H) is coupled for receiving the propagate signal ($P_i$–$P_{i+8}$) for the associated bit pair. Eight NMOS transistors 68 (A–H) are coupled to nodes $C_{i+1}$–$C_{i+8}$. The gate terminal of each NMOS transistor 68 (A–H) is coupled for receiving the kill signal ($K_i$–$K_{i+8}$) for the associated bit pair.

In operation, each node $C_{i+1}$–$C_{i+8}$ is initially precharged to a high voltage potential. Thereafter, the respective propagate and kill signals are applied to NMOS transistors 64(A–H) and 68(A–H). If propagate signal $P_{i+1}$ is high, then the signal at node $C_i$ will be propagated to node $C_{i+1}$. That is, if the signal at node $C_i$ is high, then NMOS transistor 64(A) will have no effect on node $C_{i+1}$ and node $C_{i+1}$ will remain high, thus "propagating" the carry to node $C_{i+1}$. On the other hand, if the signal at node $C_i$ is low, then NMOS transistor 64 (A) will discharge node $C_{i+1}$ to a low voltage potential, thus "propagating" the zero carry to node $C_{i+1}$. If kill signal $K_{i+1}$ is high, then NMOS transistor 68(A) will discharge node $C_{i+1}$ to ensure that a zero carry is represented by node $C_{i+1}$. If neither a propagate nor a kill signal is generated ($P_{i+1}$ and $K_{i+1}$ are both low), then a generate condition is indicated by the high signal which remains on node $C_{i+1}$. Thus, the carry chain may be said to be initialized to an all-generate state.

Carry Chain Cell

Figure 4:
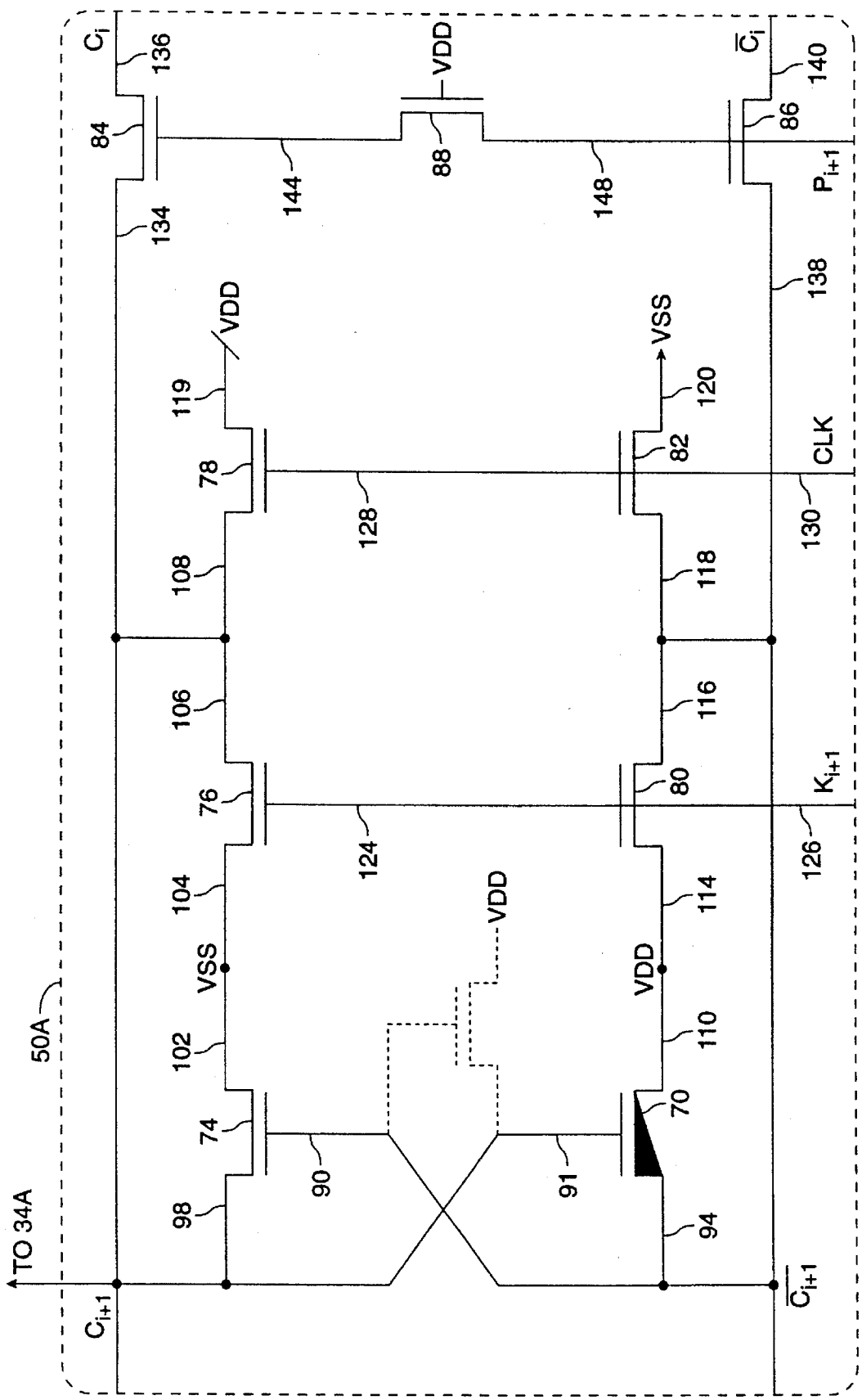
FIG. 4 is a schematic diagram of a particular embodiment of a carry chain cell shown in FIG. 3.

FIG. 4 is a schematic diagram of a carry chain cell, e.g., carry chain cell 50(A). All carry chain cells are constructed the same way. Carry chain cell 50(A) implements a carry chain in a complementary manner using a regenerative push-pull differential logic (RPPDL) element. The theory and operation of RPPDL elements are discussed in copending U.S. patent application Ser. No. 08/121,136, filed Sep. 14, 1993, entitled "CMOS Circuit for Implementing Boolean Functions", incorporated herein by reference as noted above.

Carry chain cell 50(A) comprises a PMOS transistor 70 and NMOS transistors 74,76,78,80,82,84,86, and 88. A gate terminal 90 of NMOS transistor 74 is coupled to a drain terminal 94 of PMOS transistor 70 and to node $\overline{C_{i+1}}$. A gate terminal 91 of PMOS transistor 70 is coupled to a drain terminal 98 of NMOS transistor 74 and to node $C_{i+1}$. A source terminal 102 of NMOS transistor 74 is coupled to a low voltage potential (e.g., VSS or ground). A source terminal 104 of NMOS transistor 76 is coupled to the low voltage potential, and a drain terminal 106 of NMOS transistor 76 is coupled to a source terminal 108 of NMOS transistor 78. A drain terminal 119 of NMOS transistor 78 is coupled to a high voltage potential (e.g., VDD). A source terminal 110 of PMOS transistor 70 is coupled to a high voltage potential (e.g., VDD) and to a drain terminal 114 of NMOS transistor which 80 is also coupled to the high voltage potential, and a source terminal 116 of NMOS transistor 80 is coupled to a drain terminal 118 of NMOS transistor 82. A source terminal 120 of NMOS transistor 82 is coupled to a low voltage potential (VSS or ground). The gate terminals 124, 126 of NMOS transistors 76 and 80, respectively, are coupled for receiving kill signal $K_{i+1}$, and the gate terminals 128, 130 of NMOS transistors 78 and 82, respectively, are coupled for receiving the CLK signals. A drain terminal 134 of NMOS transistor 84 is coupled to node $C_{i+1}$, and a source terminal 36 of NMOS transistor 84 is coupled to node $C_i$. A source terminal 138 of NMOS transistor 86 is coupled to node $C_{i+1}$, and a drain terminal 140 of NMOS transistor 86 is coupled to node $\overline{C_i}$. NMOS transistor 88 is coupled between gate terminals 144, 148 of NMOS transistors 84 and 86, respectively. The gate terminal of NMOS transistor 88 is coupled to a high voltage potential. Gate terminal 148 of NMOS transistor 86 is coupled for receiving propagate signal $P_{i+1}$.

In operation, a high CLK signal precharges node $C_{i+1}$ to a high voltage potential and predischarges node $\overline{C_{i+1}}$ to a low voltage potential for rendering NMOS transistor 74 and PMOS transistor 70 nonconductive. Thereafter, the kill signal is applied to NMOS transistors 76 and 80, and the propagate signal is applied to NMOS transistors 84 and 86. If the kill signal is high, then NMOS transistors 76 and 80 become conductive for lowering the voltage potential at node $C_{i+1}$ and raising the voltage potential at node $\overline{C_{i+1}}$. The altered potentials render NMOS transistor 74 and PMOS transistor 70 conductive for latching node $C_{i+1}$ to a low voltage potential and for latching node $\overline{C_{i+1}}$ to a high voltage potential. This indicates the absence of a carry at nodes $C_{i+1}$ and $\overline{C_{i+1}}$. If the propagate signal is high, then NMOS transistors 84 and 86 are rendered conductive for propagating the signal at nodes $C_i$ and $\overline{C_i}$ to nodes $C_{i+1}$ and $\overline{C_{i+1}}$, respectively. Thus, if node $C_i$ is high and node $\overline{C_i}$ is low (indicating the existence of a carry), then nodes $C_{i+1}$ and $\overline{C_{i+1}}$ will remain high and low, respectively, thus "propagating" the carry signals to nodes $C_{i+1}$ and $\overline{C_{i+1}}$. Similarly, if node $C_i$ is low and node $\overline{C_i}$ is high, then the signals will be propagated to nodes $C_{i+1}$ and $\overline{C_{i+1}}$ to alter their voltage potentials and render NMOS transistor 74 and PMOS transistor 70 conductive. When that happens, nodes $C_{i+1}$ and $\overline{C_{i+1}}$ will be latched at low and high voltage potentials, respectively, thus "propagating" the absence of a carry from nodes $C_i$ and $\overline{C_i}$.

The propagate signals and the signals at nodes $C_i$ through $C_{i+1}$ in each carry chain circuit are communicated to their associated sum multiplexer. These signals may be used by the sum generating circuits 44 (A–H) to generate the actual eight-bit sum. For example, the sum represented by node $C_{i+1}$ is zero if the following is true: (1) $C_{i+1}$ low, $C_i$ low, $P_{i+1}$ low; (2) $C_{i+1}$ high, $C_i$ low, $P_{i+1}$ low; or (3) $C_{i+1}$ high, $C_i$ high, $P_{i+1}$ low. The sum represented by node $C_{i+1}$ is one if the following is true: (1) $C_{i+1}$ low, $C_i$ high, $P_{i+1}$ low; (2) $C_{i+1}$ low, $C_i$ low, $P_{i+1}$ high; and (3) $C_{i+1}$ high, $C_i$ high, $P_{i+1}$ low.

Byte Carry Generating Circuits

Byte carry generating circuits 18(A–H) generate the signals used by multiplexers 34(A–H) to select the correct sum for output. Byte carry generate circuit 34A merely comprises the carry output signals from carry chain circuit 30A. The other circuits are more complicated. In order to determine which carry chain circuit made the correct assumption about the existence or nonexistence of a carry from the previous carry chain circuit, it is necessary to take into account all carry chain circuits which preceded it. For example, in order for the sum generated from the output of carry chain circuit 30(C) to be selected by byte carry generating circuit 18(B), then either carry chain circuit 26(B) or carry chain circuit 30(B) must have produced a zero carry-out signal and the carry chain circuit which produced the zero carry-out signal must have been the carry chain circuit which produced the correct output for adder cell 14(B). That can only be ascertained by referring to the carry-out signal from carry chain circuit 30(A).

Since the logic for determining which carry chain circuit produced the correct values becomes more and more complicated as one proceeds up the chain, parallel processing by the byte carry generating circuits is split between the first and last thirty-two bits of the sixty-four bit adder 10. Byte carry generating circuits 18(A–D) and 18(E–H) both operate in parallel, but byte carry generating circuits 18(E–H) wait for the select signal from byte carry generating circuit 18D to keep circuit complexity to a minimum.

Figure 5A:
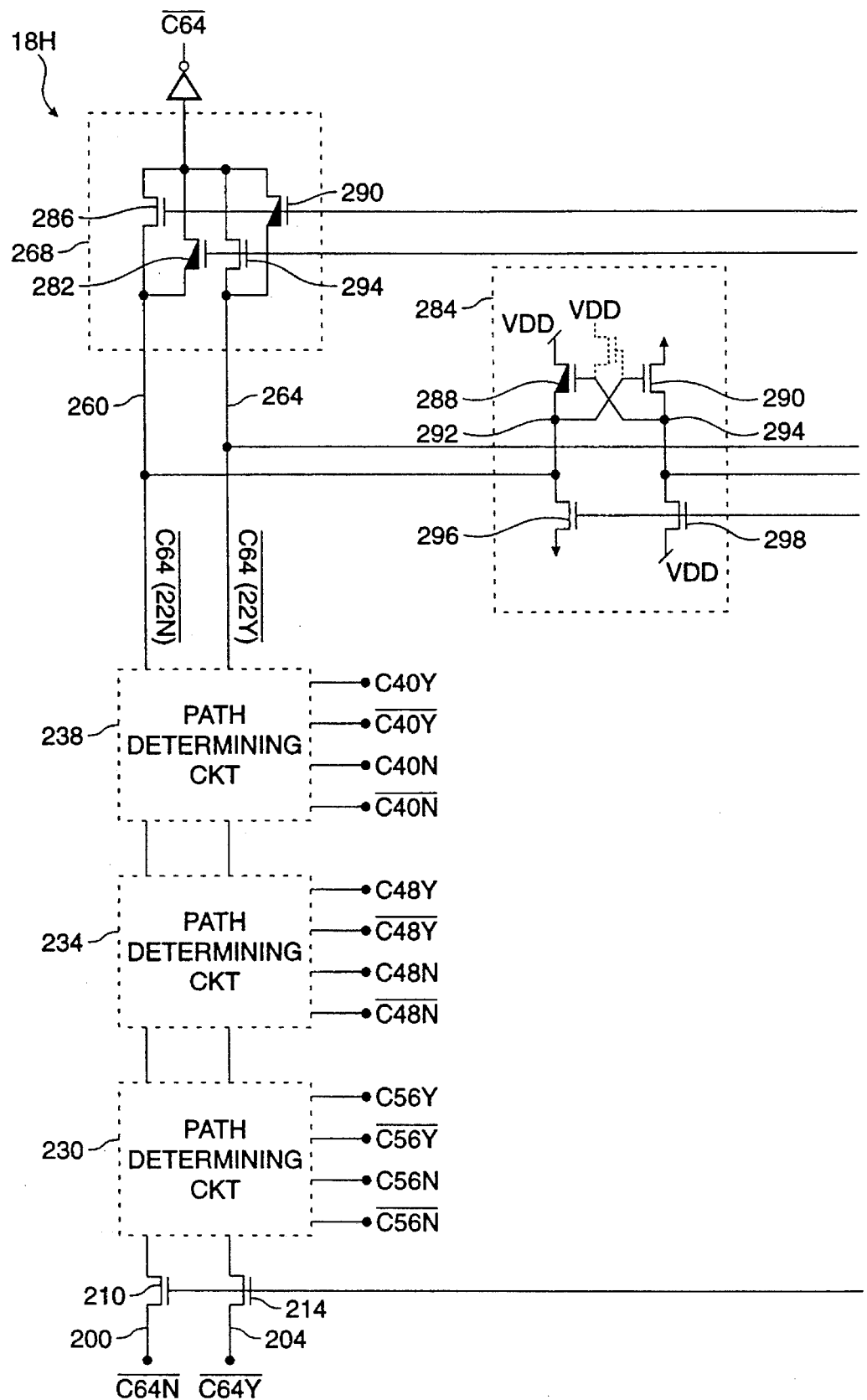
FIG. 5 is a schematic diagram of a particular embodiment of a byte generating circuit according to the present invention.
Figure 5B:
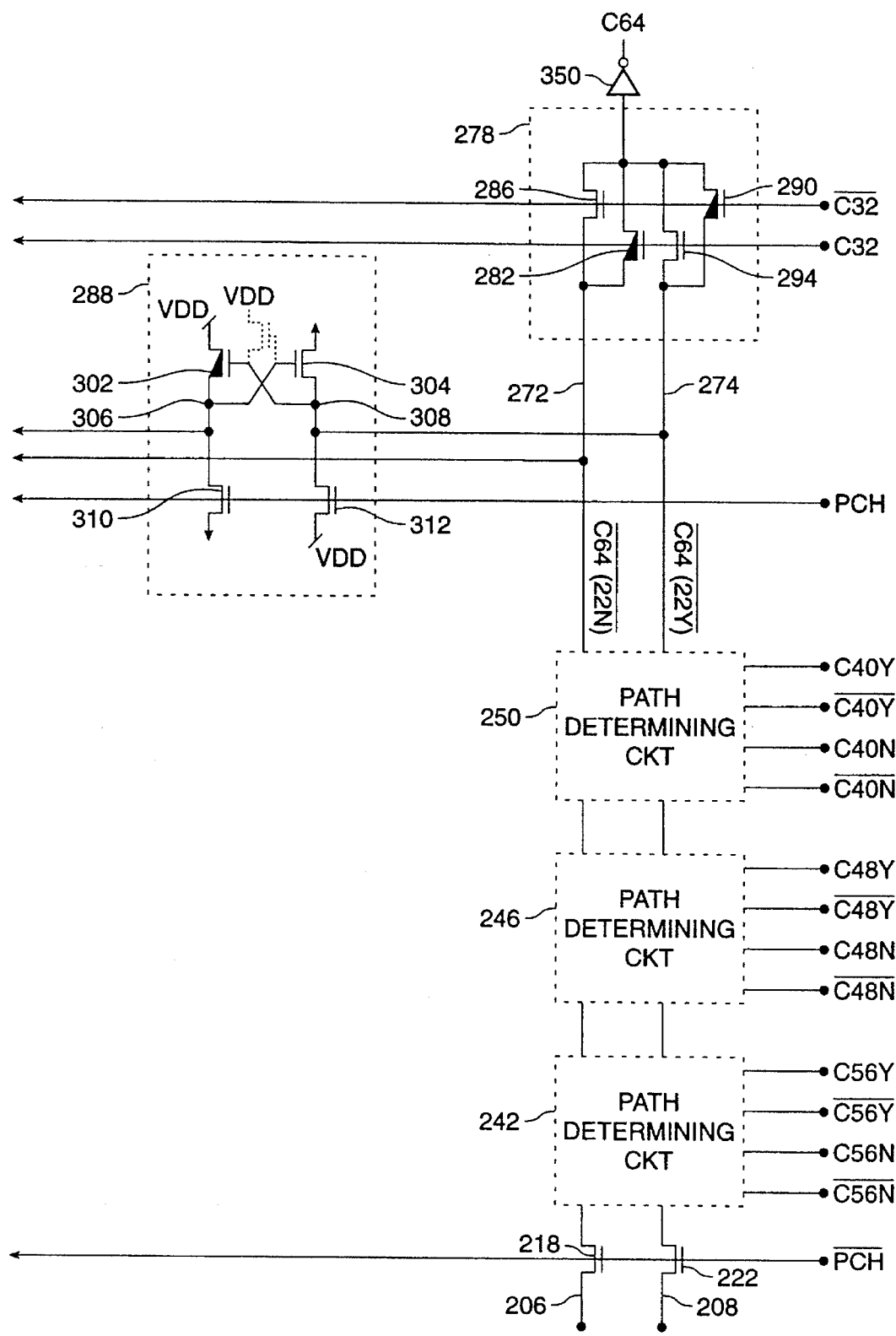

To illustrate the structure of byte generating circuits 18(A–H), byte generating circuit 18(H) shall be described in conjunction with FIG. 5. As shown in FIG. 5, byte carry generating circuit 18(H) receives the carry-out signals from carry chain 26(H) and 30(H) over lines 200, 204, 206, and 208, which, in turn, comprise first current flowing terminals of NMOS transistors 210, 214, 218, and 222. The other current flowing terminals of NMOS transistors 210 and 214 are coupled to serially chained path determining circuits 230, 234 and 238, and the other current flowing terminals of NMOS transistors 218 and 222 are coupled to serially chained path determining circuits 242, 246, and 250. The gate terminals of NMOS transistors 210, 214, 218, and 222 are coupled for receiving the PCH signal from dummy carry chain circuit 26A.

Figure 6:
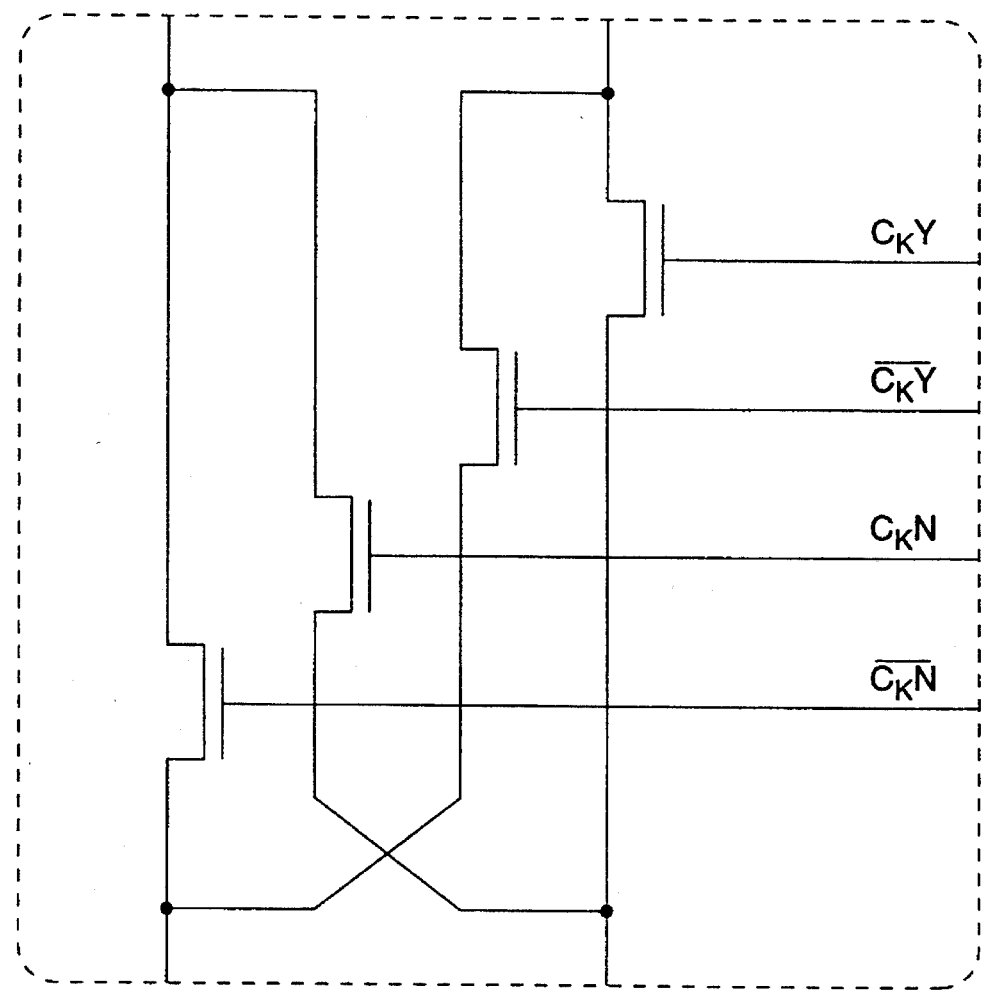
FIG. 6 is a schematic diagram of a particular embodiment of a path selection circuit shown in FIG. 5.

Path determining circuits 230 and 242 simulate the possible signal paths through carry chain circuits 26(G) and 30(G); path determining circuits 234 and 246 simulate the possible signal paths through carry chain circuits 26(F) and 30(F), and path determining circuits 238 and 250 simulate the possible signal paths through carry chain circuits 26(E) and 30(E). In general, the path on the left indicates the path through a carry chain circuit which assumed the nonexistence of a carry from the carry chain circuit before it, and the path on the right indicates the path through a carry chain circuit which assumed the existence of a carry from the carry chain circuit before it. The structure of each path determining circuit is shown in FIG. 6.

Path lines 260 and 264 from path determining circuit 238 is coupled to a path selecting circuit 268, and path lines 272 and 274 from path determining circuit 250 are coupled to path selecting circuit 278. Path selecting circuits 268 and 278 select the correct paths (one on each side), and hence the correct value of the carry output from adder section 14(H), in response to the carry output signal from byte carry generate circuit 18(D). Each path select circuit is constructed the same. Using path select circuit 268 as an example, path select circuit 268 comprises parallel connected PMOS transistor 282 and NMOS transistor 286 and parallel connected PMOS transistor 290 and NMOS transistor 294. The gate terminals of NMOS transistor 286 and PMOS transistor 290 are coupled together for receiving the C32 signal, and the gate terminals of PMOS transistor 282 and NMOS transistor 294 are coupled together for receiving the C32 signal.

RPPDL elements 284 and 288 are provided for latching the signals on path lines 260, 264, 272, and 274, and they operate much like the RPPDL elements used in the carry chain circuits. RPPDL element 284 comprises PMOS transistor 285 and NMOS transistor 291 cross-coupled at nodes 292 and 293. Node 292 (and hence path line 260) is predischarged through NMOS transistor 296, and node 293 (and hence path line 272) is precharged through NMOS transistor 298. The gate terminals of NMOS transistors 296, 298, 310, and 312 are coupled for receiving the PCH signal from dummy carry chain circuit 26(A). Similarly, RPPDL element 288 comprises PMOS transistor 302 and NMOS transistor 304 cross-coupled at nodes 306 and 308. Node 306 (and hence path line 264) is predischarged through NMOS transistor 310, and node 308 (and hence path line 274) is precharged through NMOS transistor 312. The gate terminals of NMOS transistors 296, 298, 310, and 312 are coupled for receiving the PCH signal from dummy carry chain circuit 26(A).

As an example of the operation of byte carry generate circuit 18(H), assume C32 is low, C40Y is high, C40N is low, C48Y is low, C48N is high, and both C56Y and C56N are low. Of course, the complementary signals will have the opposite values. Following the signal path on the right hand side of the circuit, the low C32 signal renders NMOS transistor 286 and PMOS transistor 282 conductive for selecting the left path (path line 272) into path determining circuit 250 (no carry-in to adder section 14(E)). Since C40N is low (no carry-out from carry chain circuit 30E), path determining circuit 250 selects the left path into path determining circuit 246. Since C48Y is high (a carry-out from carry chain circuit 30(F)), path determining circuit 246 selects the right hand path into path determining circuit 242. Since C56N is low, path determining circuit 242 selects the left path to NMOS transistor 218. The completed path hence couples the C64N signal to output inverter 350.

Dummy Carry Chain

Dummy carry chain 26A is provided for timing the operation of byte carry generating circuits 18(B–H). It has the same structure as the other carry chain circuits. Since the byte carry generating circuits are dynamic, they cannot trigger until the input carry signals are available. Since all carry chains operate in parallel, proper setup should be achieved if dummy carry chain 26A simulates the worst-case timing of the carry chain circuits. In this embodiment, dummy carry chain 26A accomplishes this by propagating a low signal from the input to the output terminals, and the output terminals provide the PCH signals used to precharge the nodes in the byte carry generating circuits and to enable propagation of the selected C64Y and C64N signals to the output inverters.

While the above is a description of a preferred embodiment of the present invention, various modifications may be employed. Consequently, the scope of the invention should be ascertained by the appended claims.

What is claimed is:

1. A circuit for adding binary numbers comprising:

a carry indicating circuit for generating a carry-in signal indicating whether the addition of a first plurality of bits of the binary numbers to be added results in a carry;

a first carry chain circuit connected to the carry indicating circuit for generating a first carry-out signal indicating whether the addition of a second plurality of bits of the binary numbers to be added together with a carry from the addition of the first plurality of bits of the binary numbers to be added results in a carry;

a second carry chain circuit connected to the carry indicating circuit for generating a second carry-out signal indicating whether the addition of the second plurality of bits of the binary numbers to be added without a carry from the addition of the first plurality of bits of the binary numbers to be added results in a carry; and wherein the first and second carry chain circuits each include:

a first transistor connected to a second transistor so that the first and second transistors may be initially biased in a nonconducting state when a first node is at a first voltage potential and a second node is at a second voltage potential, the first voltage potential being different from the second voltage potential; and altering means for altering the voltage potential at the first and second nodes and for causing the first and second transistors to be in a conducting state and for accelerating the voltage change at the first and second nodes to final voltage potentials; and selection circuitry, coupled to the carry indicating circuit and to the first and second carry chain circuits, for selecting either the first carry-out signal or the second carry-out signal in response to the carry-in signal.

2. A circuit for adding binary numbers comprising:

a carry indicating circuit for generating a carry-in signal indicating whether the addition of a first plurality of bits of the binary numbers to be added results in a carry;

a first carry chain circuit connected to the carry indicating circuit for generating a first carry-out signal indicating whether the addition of a second plurality of bits of the binary numbers to be added together with a carry from the addition of the first plurality of bits of the binary numbers to be added results in a carry;

a second carry chain circuit connected to the carry indicating circuit for generating a second carry-out signal indicating whether the addition of the second plurality of bits of the binary numbers to be added without a carry from the addition of the first plurality of bits of the binary numbers to be added results in a carry; and selection circuitry, coupled to the carry indicating circuit and to the first and second carry chain circuits, for selecting either the first carry-out signal or the second carry-out signal in response to the carry-in signal;

wherein the selection circuitry includes:

a first transistor connected to a second transistor so that the first and second transistors may be initially biased in a nonconducting state when a first node is at a first voltage potential and a second node is at a second voltage potential, the first voltage potential being different from the second voltage potential; and altering means for altering the voltage potential at the first and second nodes in response to the carry-in signal for causing the first and second transistors to be in a conducting state and for accelerating the voltage change at the first and second nodes to final voltage potentials.

\* \* \* \* \*